(12) United States Patent
Lee

(10) Patent No.: US 10,650,865 B2
(45) Date of Patent: May 12, 2020

(54) LOW VOLTAGE DETECTION CIRCUIT AND MEMORY DEVICE INCLUDING THE SAME

(71) Applicant: SK hynix Inc., Gyeonggi-do (KR)

(72) Inventor: Hyun Chul Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/170,934

(22) Filed: Oct. 25, 2018

(65) Prior Publication Data
US 2019/0279687 A1    Sep. 12, 2019

(30) Foreign Application Priority Data
Mar. 8, 2018 (KR) .................. 10-2018-0027536

(51) Int. Cl.
| | | |
|---|---|---|
| *G11C 5/14* | (2006.01) | |
| *H03K 5/24* | (2006.01) | |
| *G01R 19/165* | (2006.01) | |
| *G11C 16/30* | (2006.01) | |
| *H03K 5/00* | (2006.01) | |

(52) U.S. Cl.
CPC ........ *G11C 5/144* (2013.01); *G01R 19/16538* (2013.01); *G11C 5/147* (2013.01); *H03K 5/24* (2013.01); *G11C 16/30* (2013.01); *H03K 2005/00078* (2013.01)

(58) Field of Classification Search
CPC .................................. G11C 5/144; H01K 5/24
USPC ........................................................ 365/226
See application file for complete search history.

(56) References Cited

U.S. PATENT DOCUMENTS

2009/0015980 A1 * 1/2009 Fukano ............... F16K 31/0675
361/194

FOREIGN PATENT DOCUMENTS

KR    1020160074253    6/2016

* cited by examiner

*Primary Examiner* — Jason Lappas
(74) *Attorney, Agent, or Firm* — IP & T Group LLP

(57) ABSTRACT

In a low voltage detection circuit having improved detection performance, the low voltage detection circuit includes: a comparison voltage generator for generating a first comparison voltage and a second comparison voltage having a level higher than that of the first comparison voltage by dividing a power voltage; a first comparator for outputting a low voltage detection enable signal by comparing the first comparison voltage with a reference voltage; a second comparator for outputting a detection signal by comparing the second comparison voltage with the reference voltage while the low voltage detection enable signal is being input; a detection signal maintainer for providing a low voltage detection signal to an output terminal according to the detection signal; and an output signal discharger for discharging the low voltage detection signal according to the low voltage detection enable signal.

15 Claims, 10 Drawing Sheets

LOW VOLTAGE DETECTION CIRCUIT AND MEMORY DEVICE INCLUDING THE SAME

CROSS-REFERENCE TO RELATED APPLICATION

The present application claims priority under 35 U.S.C. § 119(a) to Korean patent application number 10-2018-0027536, filed on Mar. 8, 2018, the entire disclosure of which is herein incorporated herein by reference in its entirety.

BACKGROUND

1. Field of Invention

Various embodiments of the present disclosure generally relate to an electronic device. Particularly, the embodiments relate to a low voltage detection circuit and a memory device including the same.

2. Description of Related Art

A storage device stores data under the control of a host device such as a computer, a smart phone, or a tablet PC. The storage device may include a memory device for storing data and a memory controller for controlling the memory device. The memory device may be a volatile memory device or a nonvolatile memory device.

In a volatile memory device, stored data is not retained when the power supply is interrupted. Examples of the volatile memory are a Static Random Access Memory (SRAM), a Dynamic RAM (DRAM), a Synchronous DRAM (SDRAM), and the like.

In a nonvolatile memory device, stored data is retained even when the power supply is interrupted. Examples of the nonvolatile memory are a Read Only Memory (ROM), a Programmable ROM (PROM), an Electrically Programmable ROM (EPROM), an Electrically Erasable and Programmable ROM (EEPROM), a flash memory, a Phase-change RAM PRAM), a Magnetic RAM (MRAM), a Resistive RAM (RRAM), a Ferroelectric RAM (FRAM), and the like. The nonvolatile memory device may include a low voltage detection circuit for sensing a voltage drop of a power voltage input from an external power supply.

SUMMARY

Embodiments provide a low voltage detection circuit having more accurate detection performance and a memory device including the same.

According to an aspect of the present disclosure, there is provided a low voltage detection circuit including: a comparison voltage generator configured to generate a first comparison voltage and a second comparison voltage having a level higher than that of the first comparison voltage by dividing a power voltage; a first comparator configured to output a low voltage detection enable signal by comparing the first comparison voltage with a reference voltage; a second comparator configured to output a detection signal by comparing the second comparison voltage with the reference voltage while the low voltage detection enable signal is being input; a detection signal maintainer configured to provide a low voltage detection signal to an output terminal according to the detection signal; and an output signal discharger configured to discharge the low voltage detection signal according to the low voltage detection enable signal.

According to another aspect of the present disclosure, there is provided a memory device including: a memory cell array including a plurality of memory cells; a voltage generator configured to generate an operation voltage to be supplied to the plurality of memory cells; and control logic configured to provide the operation voltage to the plurality of memory cells or discharge the provided operation voltage, wherein the voltage generator further includes a low voltage detection circuit configured to output a low voltage detection signal to the control logic when a power voltage input from the outside corresponds to a low voltage state, wherein the low voltage detection circuit includes: a comparison voltage generator configured to generate a first comparison voltage and a second comparison voltage having a level higher than that of the first comparison voltage by dividing the power voltage; a first comparator configured to output a low voltage detection enable signal by comparing the first comparison voltage with a reference voltage; a second comparator configured to output a detection signal by comparing the second comparison voltage with the reference voltage while the low voltage detection enable signal is being input; a detection signal maintainer configured to provide a low voltage detection signal to an output terminal according to the detection signal; and an output signal discharger configured to discharge the low voltage detection signal according to the low voltage detection enable signal.

According to another aspect of the present disclosure, there is provided a memory device including: a memory cell array; a low voltage detector configured to generate, while a first comparison voltage is lower than a reference voltage, a detection signal when a second comparison voltage becomes lower than the reference voltage or when the second comparison voltage then becomes higher than the reference voltage; and control logic configured to discharge an operation voltage to the memory cell array according to the detection signal, wherein the first and second comparison voltages are divided from a power voltage, and wherein the first comparison voltage is lower than the second comparison voltage.

BRIEF DESCRIPTION OF THE DRAWINGS

Various embodiments will now be described more fully with reference to the accompanying drawings; however, elements and features of the embodiments may be configured or arranged differently than illustrated and described. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
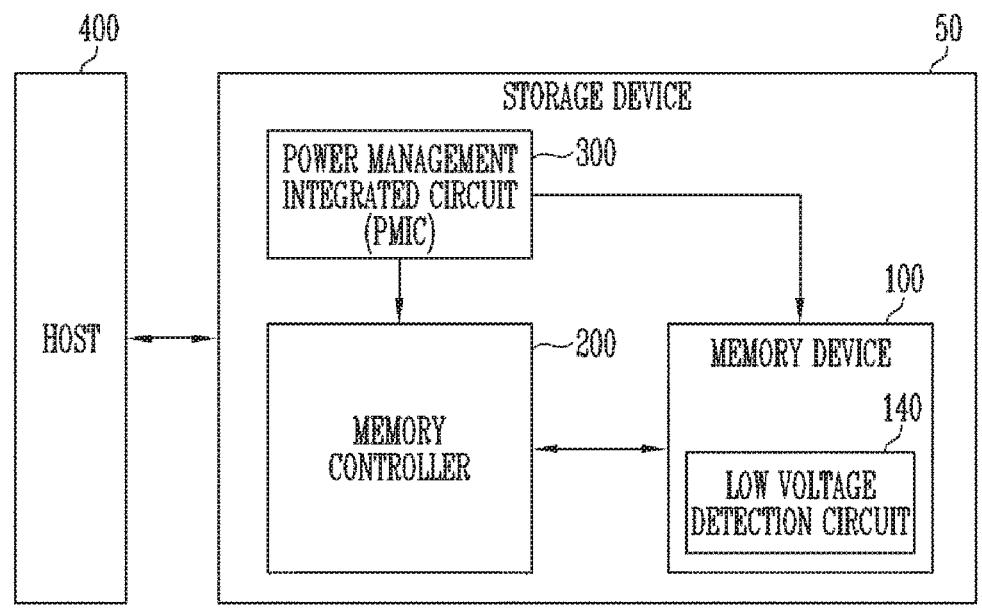
FIG. 1 is a diagram illustrating a storage device according to an embodiment of the present disclosure.

The specific structural and functional description herein is merely for the purpose of describing embodiments of the present disclosure. The embodiments can be implemented in various other ways, and thus the present invention is not limited to the embodiments set forth herein.

Various aspects (e.g., shape, configuration, and the like) of elements and features of the disclosed embodiments may be modified in various ways. Thus, embodiments of the present disclosure are not to be construed as limited to specified disclosures, but rather include all changes, equivalents, or substitutes that do not depart from the spirit and technical scope of the present disclosure.

While terms such as "first" and "second" may be used to identify various components, such components are not limited to the above terms. The above terms are used only to distinguish one component from another that otherwise have the same or similar names. For example, a first component may be referred to as a second component without departing from the scope of the present disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Other expressions describing relationships between components such as "between," "immediately between" or "adjacent to" and "directly adjacent to" are to be construed similarly.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," etc., are intended to indicate the presence of stated features, numbers, operations, actions, components, parts, or combinations thereof, but are not intended to preclude the presence or addition of one or more other features, numbers, operations, actions, components, parts, or combinations thereof.

Unless defined differently, all terms used herein including technical or scientific terminologies have meanings that are commonly understood by those skilled in the art to which the present disclosure pertains. Ordinary, dictionary-defined terms should be construed consistent with the context of the related technique. Unless dearly defined in this application, terms should not be understood or construed in an ideally or excessively formal way.

Description of techniques that are well known to the art to which the present disclosure pertains and not directly related to the present disclosure is omitted so as not to unnecessarily obscure aspects and features of the present invention.

Various embodiments of the present disclosure will be described in detail with reference to the accompanying drawings in order for those skilled in the art to be able to readily implement the present invention. It is noted that, throughout the specification, reference to "an embodiment" or the like is not necessarily to only one embodiment, and different references to "an embodiment" or the like are not necessarily to the same embodiment(s).

FIG. 1 is a diagram illustrating a storage device according to an embodiment of the present disclosure.

Referring to FIG. 1, the storage device may include a memory device 100, a memory controller 200, and a power management integrated circuit (PMIC) 300.

The storage device 50 may store data under the control of a host 400, such as a mobile phone, a smart phone, an MP3 player, a laptop computer, a desktop computer, a game console, a TV, a tablet PC or an in-vehicle infotainment system.

The storage device 50 may be any one of various types of storage devices according to a host interface protocol for communication with the host 400. For example, the storage device 50 may be implemented with any one of various types of storage devices such as a multi-media card of a solid state drive (SSD), a multi-media card (MMC), an embedded, multi-media card (eMMC), a reduced size, multi-media card (RS-MMC), and a micro-multi-media card (micro-MMC) type, a secure digital (SD) card of a secure digital (SD), a mini-secure digital (mini-SD) and a micro-secure digital (micro-SD) type, an universal storage bus (USB) storage device, a universal flash storage (UFS) device, a storage device of a personal computer memory card international association (PCMCIA) card type, a storage device of a peripheral component interconnection (PCI) card type, a storage device of a PCI-express (PCI-E) card type, a compact flash (CF) card, a smart media card, and a memory stick.

The storage device 50 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP), and a wafer-level stack package (WSP).

The memory device 100 may store data. The memory device 100 operates under the control of the memory controller 200. The memory device 100 may include a memory cell array (not shown) including a plurality of memory cells for storing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a program operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

In an embodiment, the program operation and the read operation may be performed in units of pages, and the erase operation may be performed in units of blocks.

The memory device 100 may receive a power voltage VCCE from the PMIC 300. In order to ensure the reliability of the memory device 100, the memory device 100 may perform various management operations according to changes in level of the power voltage VCCE.

For example, when a sudden power off (SPO) occurs due to sudden cut off of the supply of a power voltage from the PMIC 300, a defect may occur, such as loss of data being programmed in the memory device 100. Therefore, the memory device 100 may monitor the level of the power voltage VCCE so as to safely preserve data in the event of a sudden power-off.

When the sudden power-off is predicted from the power voltage VCCE being lowered to a certain level or less, the memory device 100 may perform an operation of discharging voltages supplied to a word line WL and a bit line BL coupled to memory cells included in the memory device 100. A state in which the power voltage VCCE is at a certain low level or less may be defined as a low voltage state. The memory device 100 may further include a low voltage detection circuit 140 for detecting the low voltage state.

In an embodiment, the low voltage detection circuit 140 may compare the power voltage VCCE with a preset reference voltage $V_{REF}$ and outputs a detection signal when the level of the power voltage VCCE is lower than the reference voltage $V_{REF}$. In another embodiment, the low voltage detection circuit 140 does not compare the power voltage VCCE with the reference voltage $V_{REF}$, but may generate a comparison voltage $V_{DIV}$ compared with the reference voltage $V_{REF}$, based on the power voltage VCCE. In that case, the low voltage detection circuit 140 may compare the comparison voltage $V_{DIV}$ with the reference voltage $V_{REF}$ and output a low voltage detection signal when the comparison voltage $V_{DIV}$ is lower than the reference voltage $V_{REF}$.

In an embodiment, the memory device 100 may include a power on reset (POR) circuit to prevent malfunction when the power voltage VCCE supplied. When the power voltage VCCE is applied to the memory device 100 and then reaches a set or predetermined level, the POR circuit may provide a reset signal for initializing a flip-flop, a latch, a counter, a register, and the like, which constitute the memory device 100. For example, the memory device 100 outputs an activated reset signal when the power voltage VCCE reaches a set or predetermined level in power on. Subsequently, when the power voltage VCCE reaches a normal operation voltage, the reset signal is inactivated. Internal components of the memory device 100 may be reset to an initial state in response to the activated reset signal. In an embodiment, the POR circuit and the low voltage detection circuit 140 are separate circuits, and may detect the level of the power voltage VCCE.

The memory controller 1200 may control the overall operations of the memory device 1100. The memory controller 200 may control an operation of the memory device 100 in response to a request from the host 400 or regardless of the request from the host 400.

For example, the memory controller 200 may control the memory device 100 to perform a program operation, a read operation, an erase operation, or the like in response to a request from the host 400. In the program operation, the memory controller 200 may provide a program command, an address, and data to the memory device 100. In the read operation, the memory controller 200 may provide a read command and an address to the memory device 100. In the erase operation, the memory controller 200 may provide an erase command and an address to the memory device 100.

In an embodiment, the memory controller 200 may autonomously generate a program command, an address, and data without any request from the host 400, and transmit the program command, the address, and the data to the memory device 100. For example, the memory controller 200 may provide the command, the address, and the data to the memory device 100 to perform background operations such as a program operation for wear leveling and a program operation for garbage collection.

The memory controller 200 may execute firmware (FW) for controlling the memory device 100. When the memory device 100 is a flash memory device, the memory controller 200 may be configured to operate firmware such as a Flash Translation Layer (FTL) for controlling communication between the host 400 and the memory device 100. Specifically, the memory controller 200 may translate a logical address included in a request from the host 400 into a physical address that is to be provided to the memory device 100.

The PMIC 300 may provide power voltages required to operate the memory device 100 and the memory controller 200. In an embodiment, the voltages provided by the PMIC 300 may be 3.3V and 1.8V.

The host 400 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
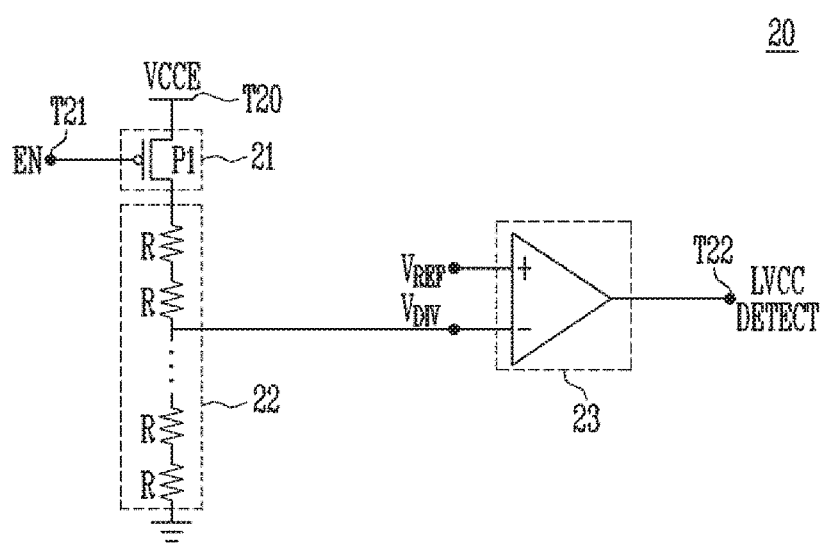
FIG. 2 is a circuit diagram of a conventional low voltage detection circuit.

FIG. 2 is a circuit diagram of a conventional low voltage detection circuit.

Referring to FIG. 2, the low voltage detection circuit 20 may include a voltage input 21, a comparison voltage generator 22, and a voltage comparator 23.

The voltage input 21 may be coupled in series to a power voltage terminal T20 and the comparison voltage generator 22. The voltage input 21 may provide a power voltage VCCE input through the power voltage terminal T20 to the comparison voltage generator 22 in response to an enable signal EN input from an input signal terminal T21. In an embodiment, the voltage input 21 may include a P-type transistor. The enable signal EN may be provided to a gate of the P-type transistor.

The comparison voltage generator 22 may be coupled in series between the voltage input 21 and a ground voltage GND. The comparison voltage generator 22 may generate a comparison voltage $V_{DIV}$ obtained by dividing the power voltage VCCE input from the voltage input 21. The comparison voltage generator 22 may output the generated comparison voltage $V_{DIV}$ to the voltage comparator 23. In an embodiment, the comparison voltage generator 22 may include a plurality of resistors R. The comparison voltage generator 22 may output, as the comparison voltage $V_{DIV}$, a voltage of a selected node among the plurality of resistors R.

The voltage comparator 23 may include an operational amplifier (OP AMP). The voltage comparator 23 may receive the comparison voltage $V_{DIV}$ output from the comparison voltage generator 22 through an inverting terminal, and receive a reference voltage $V_{REF}$ through a non-inverting terminal.

When the voltage level of the comparison voltage $V_{DIV}$ is lower than the reference voltage $V_{REF}$, the voltage comparator 23 may output a low voltage detection signal LVCC DETECT through an output terminal T22.

When the storage device 50 described with reference to FIG. 1 is a mobile device such as a mobile phone or a tablet PC, the supply performance of the PMIC 300 may be decreased when the power of a battery of the mobile device is decreased. There may occur a situation in which the power voltage VCCE applied to the memory device 100 decreases to a low voltage state and then returns to the original state. Also, there may occur a situation in which, when the power voltage VCCE is in the low voltage state, the reference voltage $V_{REF}$ input to the low voltage detection circuit 20 also drops or is low. When the decreased reference voltage VREF is less than the comparison voltage $V_{DIV}$, the low voltage detection signal LVCC DETECT is no longer output since the reference voltage $V_{REF}$ is lower than the comparison voltage $V_{DIV}$ even though the power voltage VCCE is in a state in which it has already been lowered to the low voltage state. Therefore, malfunction may be caused in the memory device 100.

Figure 3:
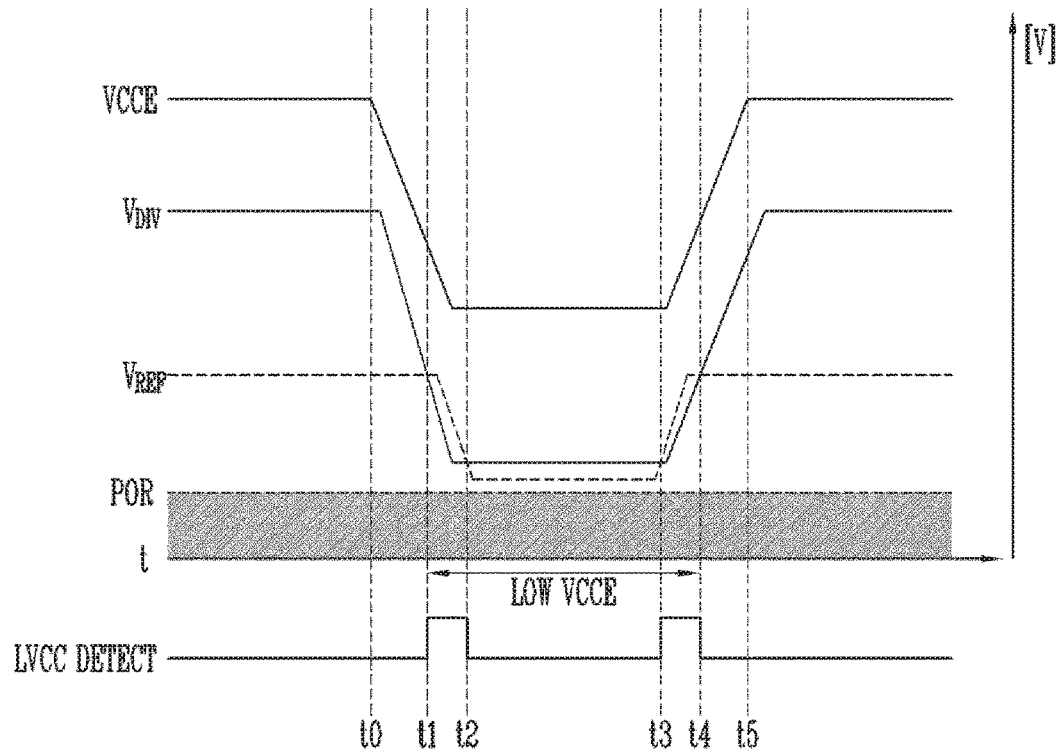
FIG. 3 is a waveform diagram illustrating an operation of the low voltage detection circuit of FIG. 2.

FIG. 3 is a waveform diagram illustrating an operation of the low voltage detection circuit 20 of FIG. 2.

Referring to FIGS. 2 and 3, the level of the power voltage VCCE maintains a normal level before t0.

The voltage level of the power voltage VCCE decreases at t0. Decrease of the voltage level of the power voltage VCCE may occur due to various causes. Since the comparison voltage $V_{DIV}$ is obtained by dividing the power voltage VCCE, the comparison voltage $V_{DIV}$ may decrease when the power voltage VCCE decreases. However, the timing and slope where the comparison voltage $V_{DIV}$ decreases may be different from those where the power voltage VCCE decreases due to various factors.

The level of the comparison voltage $V_{DIV}$ starts to become lower than the reference voltage $V_{REF}$ at time t1, and hence the input power voltage VCCE corresponds to the low voltage state. Therefore, the low voltage detection circuit 20 may output the low voltage detection signal LVCC DETECT.

There may occur a situation in which, when the power voltage VCCE is in the low voltage state, the reference voltage $V_{REF}$ input to the low voltage detection circuit 20 is also lower.

The level of the reference voltage $V_{REF}$ also decreases between times t1 and t2.

When the level of the reference voltage $V_{REF}$ decreases to a voltage level lower than that of the comparison voltage $V_{DIV}$ starting at time t2, the voltage comparator 23 of the low voltage detection circuit 20 may not output the low voltage detection signal LVCC DETECT.

The level of the reference voltage $V_{REF}$ may start again increasing just before time t3 and between times t3 and t4.

The level of the reference voltage $V_{REF}$ starts to have a voltage level higher than that of the comparison voltage $V_{DIV}$ at time t3, and hence the low voltage detection signal LVCC DETECT may be again output.

The level of the comparison voltage $V_{DIV}$ may start again increasing between times t3 and t4.

The level of the comparison voltage $V_{DIV}$ starts to have a voltage level higher than that of the reference voltage $V_{REF}$ at time t4, and hence the input power voltage VCCE is no longer the low voltage state. Therefore, the low voltage detection signal LVCC DETECT is not output.

At time t5, the level of the power voltage VCCE is restored to the state before time t0.

In FIG. 3, the time period in which the power voltage VCCE is actually in the low voltage state is from time t1 to time t4. In the low voltage detection circuit 20 described with reference to FIG. 2, when the decreased reference voltage $V_{REF}$ is lower than the comparison voltage $V_{DIV}$, the low voltage detection signal LVCC DETECT is no longer output since the reference voltage $V_{REF}$ is lower than the comparison voltage $V_{DIV}$ even though the power voltage VCCE has already been lowered to the low voltage state. Therefore, there may occur a problem in that, although the power voltage VCCE is actually in the low voltage state, the low voltage detection signal LVCC DETECT is not output.

Figure 4:
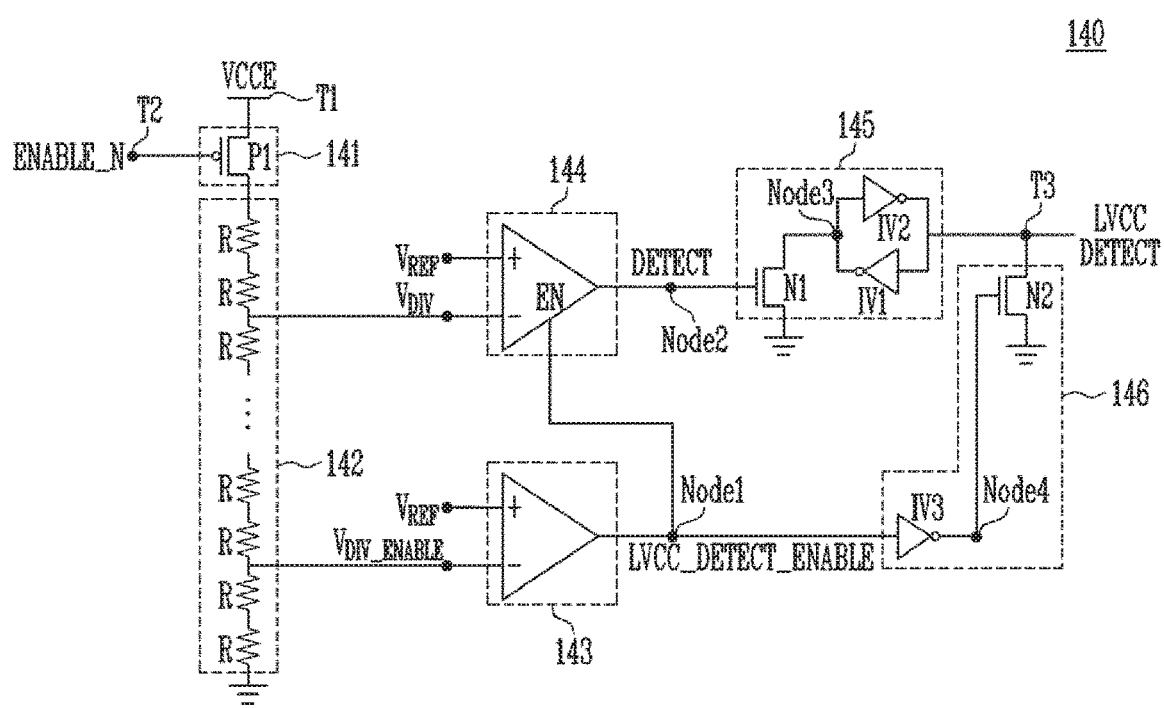
FIG. 4 is a circuit diagram illustrating a low voltage detection circuit according to an embodiment of the present disclosure.

FIG. 4 is a circuit diagram illustrating a low voltage detection circuit 140 according to an embodiment of the present disclosure.

Referring to FIG. 4, the low voltage detection circuit 140 may include a voltage provider 141, a comparison voltage generator 142, a first comparator 143, a second comparator 144, a detection signal maintainer 145, and an output signal discharger 146.

The voltage provider 141 may be coupled in series to a power voltage terminal T1 and the comparison voltage generator 142. The voltage provider 141 may provide a power voltage VCCE input through the power voltage terminal T1 to the comparison voltage generator 142 in response to an operation enable signal ENABLE_N input from an input signal terminal T2. In an embodiment, the voltage provider 141 may include a first P-type transistor P1. The operation enable signal ENABLE_N may be provided to a gate of the first P-type transistor P1.

The comparison voltage generator 142 may be coupled in series between the voltage provider 141 and a ground voltage GND. The comparison voltage generator 142 may generate a first comparison voltage $V_{DIV\_ENABLE}$ and a second comparison voltage $V_{DIV}$ by dividing the power voltage VCCE input from the voltage provider 141. The comparison voltage generator 142 may provide the generated first comparison voltage $V_{DIV\_ENABLE}$ to the first comparator 143, and provide the generated second comparison voltage $V_{DIV}$ to the second comparator 144. In an embodiment, the level of the first comparison voltage $V_{DIV\_ENABLE}$ may be lower than that of the second comparison voltage $V_{DIV}$.

In an embodiment, the comparison voltage generator 142 may include a plurality of resistors R. The comparison voltage generator 142 may output the power voltage VCCE as the first comparison voltage $V_{DIV\_ENABLE}$ or the second comparison voltage $V_{DIV}$.

The first comparator 143 may include an operational amplifier (OP AMP). The first comparator 143 may receive the first comparison voltage $V_{DIV\_ENABLE}$ output from the comparison voltage generator 142 through an inverting terminal, and receive a reference voltage $V_{REF}$ through a non-inverting terminal.

The first comparator 143 may compare levels of the first comparison voltage $V_{DIV\_ENABLE}$ and the reference voltage $V_{REF}$. The first comparator 143 may output, to a first node Node1, a result obtained by comparing the levels of the first comparison voltage $V_{DIV\_ENABLE}$ and the reference voltage $V_{REF}$. Specifically, when the level of the first comparison voltage $V_{DIV\_ENABLE}$ is lower than that of the reference voltage $V_{REF}$, the first comparator 143 may output a low voltage detection enable signal LVCC_DETECT_ENABLE. When the level of the first comparison voltage $V_{DIV\_ENABLE}$ is greater than or equal to that of the reference voltage $V_{REF}$, the first comparator 143 may not output the low voltage detection enable signal LVCC_DETECT_ENABLE.

In an embodiment, when the level of the first comparison voltage $V_{DIV\_ENABLE}$ is lower than that of the reference voltage $V_{REF}$, the first comparator 143 may output the low voltage detection enable signal LVCC_DETECT_ENABLE having a logic high level. Alternatively, when the level of the first comparison voltage $V_{DIV\_ENABLE}$ is greater than or equal to that of the reference voltage $V_{REF}$, the first comparator 143 may output the low voltage detection enable signal LVCC_DETECT_ENABLE having a logic low level.

The second comparator 144 may include an operational amplifier (OP AMP). The second comparator 144 may receive a second comparison voltage $V_{DIV}$ output from the comparison voltage generator 142 through an inverting terminal, and receive the reference voltage $V_{REF}$ through a non-inverting terminal. The second comparator 144 may compare the second comparison voltage $V_{DIV}$ and the reference voltage $V_{REF}$. When the second comparison voltage $V_{DIV}$ is lower than the reference voltage $V_{REF}$, the second comparator 144 may output a detection signal DETECT to a second node Node2.

In an embodiment, the second comparator 144 may operate in response to the low voltage detection enable signal LVCC_DETECT_ENABLE output from the first comparator 143 as an enable signal. For example, the second comparator 144 may output a result obtained by comparing the second comparison voltage $V_{DIV}$ and the reference voltage $V_{REF}$ only while the low voltage detection enable signal LVCC_DETECT_ENABLE output from the first comparator 143 is being input.

Specifically, while the low voltage detection enable signal LVCC_DETECT_ENABLE output from the first comparator 143 is being input, the second comparator 144 may output the detection signal DETECT when the second comparison voltage $V_{DIV}$ is lower than the reference voltage $V_{REF}$, and may not output the detection signal DETECT when the second comparison voltage $V_{DIV}$ is greater than or equal to the reference voltage $V_{REF}$. In an embodiment, when the low voltage detection enable signal LVCC_DETECT_ENABLE is not input, the second comparator 144 may not output any signal.

The detection signal maintainer 145 may be coupled between the second node Node2 and an output terminal T3. The detection signal maintainer 145 may output a low voltage detection signal LVCC DETECT to the output terminal T3 in response to the detection signal DETECT of the second node Node2. The detection signal maintainer 145 may maintain the low voltage detection signal LVCC DETECT output to the output terminal T3. Specifically, the detection signal maintainer 145 may include a first N-type transistor N1, a first inverter IV1, and a second inverter IV2. The first N-type transistor N1 may be coupled between the second node Node2 and a third node Node3. A gate of the first N-type transistor N1 is coupled to the second node Node2. A source of the first N-type transistor N1 is coupled to the ground voltage GND. A drain of the first N-type transistor N1 may be coupled to the third node Node3. The first inverter IV1 and the second inverter IV2 may be coupled in parallel to constitute one latch. One end of the latch may be coupled to the third node Node3, and the other end of the latch may be coupled to the output terminal T3.

The third node Node3 may have, as an initial value, a voltage of the logic high level. When the second comparator 144 outputs the detection signal DETECT to the second node Node2, the first N-type transistor N1 is turned on, and the third node Node3 may be discharged. The low voltage detection signal LVCC DETECT may be output to the output terminal T3 by the first inverter IV1 and the second inverter IV2. Even when the second comparator 144 does not output the detection signal DETECT any more, the third node Node3 is maintained to have the voltage of the logic low level by the first inverter IV1 and the second inverter IV2, and the low voltage detection signal LVCC DETECT of the output terminal T3 may be maintained.

The output signal discharger 146 may discharge the low voltage signal LVCC DETECT being output to the output terminal T3. The output signal discharger 146 may be coupled between the first node Node1 and the output terminal T3. The output signal discharger 146 may receive the low voltage detection enable signal LVCC_DETECT_ENABLE output to the first node Node1 by the first comparator 143. The output signal discharger 146 may discharge the output node T3 in response to the low voltage detection enable signal LVCC_DETECT_ENABLE.

The output signal discharger 146 may include a third inverter IV3 and a second N-type transistor N2. One end of the third inverter IV3 may be coupled to the first node Node1, and the other end of the third inverter IV3 may be coupled to a fourth node Node4. A gate of the second N-type transistor N2 may be coupled to the fourth node Node4. A source of the second N-type transistor N2 may be coupled to the ground voltage GND. A drain of the second N-type transistor N2 may be coupled to the output terminal T3.

When the first comparison voltage $V_{DIV\_ENABLE}$ is lower than the reference voltage $V_{REF}$, the first comparator 143 may output the low voltage detection enable signal LVCC_DETECT_ENABLE to the first node Node1.

The third inverter IV3 inverts the low voltage detection enable signal LVCC_DETECT_ENABLE and transfers the inverted low voltage detection enable signal LVCC_DETECT_ENABLE to the fourth node Node4. When the low voltage detection enable signal LVCC_DETECT_ENABLE is in the logic high level, the fourth node Node4 may be in the logic low level. On the contrary, when the low voltage detection enable signal LVCC_DETECT_ENABLE is in the logic low level, the fourth node Node4 may be in the logic high level. The second N-type transistor N2 may be turned on when the fourth node Node4 is in the logic high level, and be turned off when the fourth node Node4 is in the logic low level. Therefore, when the low voltage detection enable signal LVCC_DETECT_ENABLE is in the logic low level, the output signal discharger 146 may discharge the low voltage detection signal LVCC DETECT being output to the output terminal T3.

Figure 5:
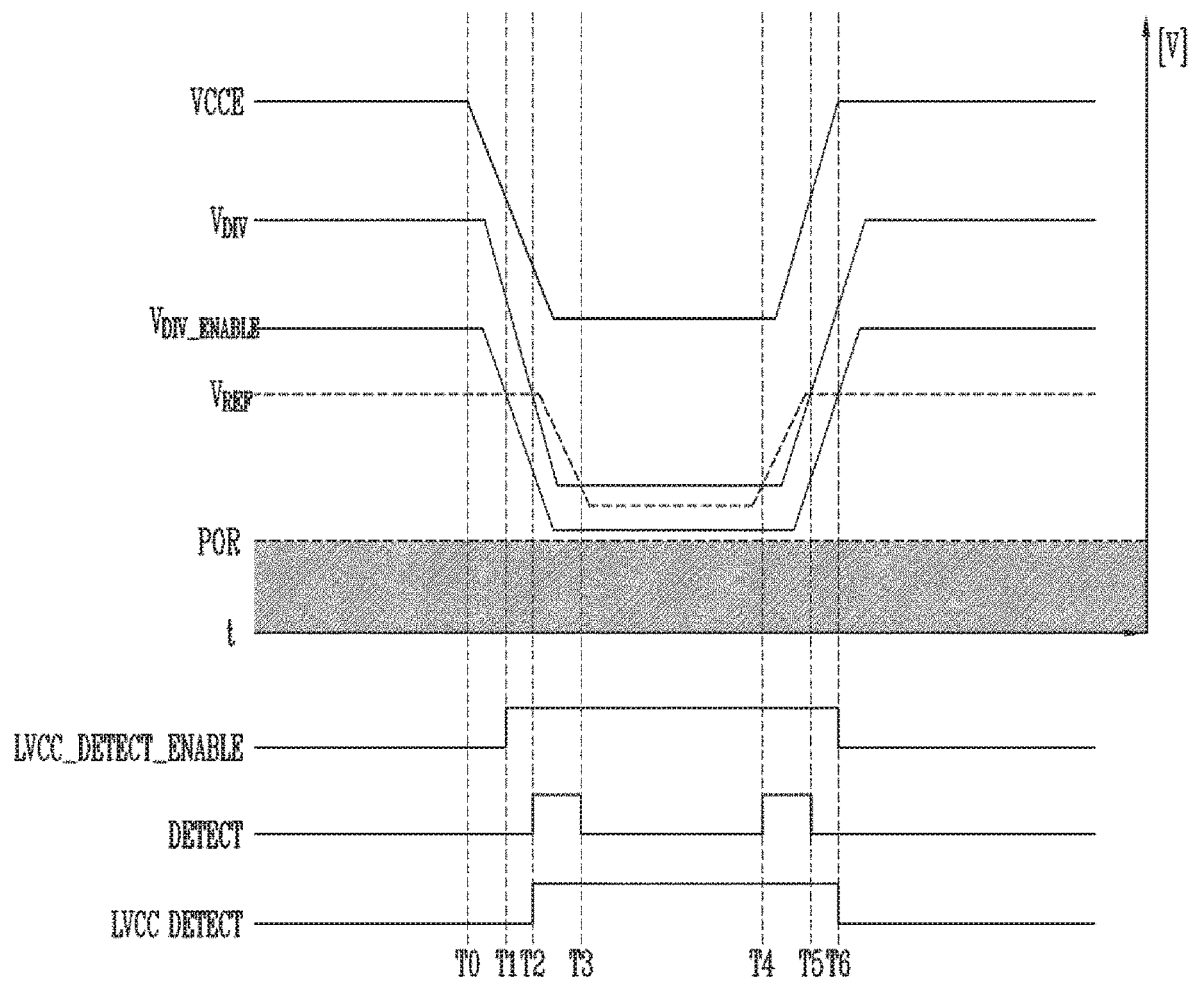
FIG. 5 is a waveform diagram illustrating an operation of the low voltage detection circuit of FIG. 4.

FIG. 5 is a waveform diagram illustrating an operation of the low voltage detection circuit 140 of FIG. 4.

Referring to FIGS. 4 and 5, the level of the power voltage VCCE maintains a normal level before time T0.

The voltage level of the power voltage VCCE decreases starting at time T0. Decrease of the voltage level of the power voltage VCCE may occur due to various causes. Since the first comparison voltage $V_{DIV\_ENABLE}$ is a voltage obtained by dividing the power voltage VCCE, the first comparison voltage $V_{DIV\_ENABLE}$ may also decrease when the power voltage VCCE decreases. However, the timing and slope where the first comparison voltage $V_{DIV\_ENABLE}$ and the second comparison voltage $V_{DIV}$ decrease may be different from those where the power voltage VCCE decreases due to various factors.

At time T1, the level of the second comparison voltage $V_{DIV}$ is higher than the reference voltage $V_{REF}$, but the voltage of the first comparison voltage $V_{DIV\_ENABLE}$ starts to become lower than the reference voltage $V_{REF}$. Therefore, the low voltage detection enable signal LVCC_DETECT_ENABLE may be output.

At time T2, the first comparison voltage $V_{DIV\_ENABLE}$ may be in a state in which it is still lower than the reference voltage $V_{REF}$, and the second comparison voltage $V_{DIV}$ may also start to become lower than the reference voltage $V_{REF}$. Therefore, the second comparator 144 may output the detection signal DETECT, and the output terminal T3 may output the low detection signal LVCC DETECT. There may occur a situation in which, when the power voltage VCCE is in the low voltage state, the reference voltage $V_{REF}$, which is input to the low voltage detection circuit 140, may also decrease.

The level of the reference voltage $V_{REF}$ also decreases between the time points T2 and T3.

When the level of the reference voltage $V_{REF}$ decreases to a voltage lower than the second comparison voltage $V_{DIV}$ starting at time T3, the second comparator 144 of the low voltage detection circuit 140 may not output the detection signal DETECT. However, the voltage comparator 23 may not output the low voltage detection signal LVCC DETECT. However, the low voltage detection signal LVCC DETECT may be maintained due to the latch included in the detection signal maintainer 145.

The level of the reference voltage $V_{REF}$ may start again increasing between time points T3 and T4.

The voltage level of the reference voltage $V_{REF}$ starts to become higher than that of the second comparison voltage $V_{DIV}$ at time T4, and hence the low voltage detection signal LVCC DETECT may be again output.

The levels of the first comparison voltage $V_{DIV\_ENABLE}$ and the second comparison voltage $V_{DIV}$ may start again increasing between time points T4 and T5.

The level of the second comparison voltage $V_{DIV}$ starts to become higher than that of the reference voltage $V_{REF}$ at time T5, and hence the input power voltage VCCE is no longer the low voltage state. The second comparator 144 may not output the detection signal DETECT.

At time T6, the first comparison voltage $V_{DIV\_ENABLE}$ starts to have a level higher than that of the reference voltage $V_{REF}$. Therefore, the first comparator 143 does not output the low voltage detection enable signal LVCC_DETECT_ENABLE. When the low voltage detection enable signal LVCC_DETECT_ENABLE is changed to have the logic low level, the output signal discharger 146 may discharge the low detection signal LVCC DETECT of the output terminal T3.

At time T6, the level of power voltage VCCE returns to the state or level that it had before time T0.

In FIG. 5, the time period in which the power voltage VCCE is in the low voltage state is from time T2 to time T5.

In the low voltage detection circuit 140 described with reference to FIG. 4, although the decreased reference voltage $V_{REF}$ is less than the second comparison voltage $V_{DIV}$, the low voltage detection signal LVCC DETECT of the output terminal at time T3 is maintained to have the logic high level. Thus, the problem can be prevented, in that although the power voltage VCCE is actually in the low voltage state, the low voltage detection signal LVCC DETECT is not output.

In the embodiment described with reference to FIGS. 4 and 5, each of the first comparison voltage $V_{DIV\_ENABLE}$ and the second comparison voltage $V_{DIV}$ is compared with the reference voltage $V_{REF}$. However, the present disclosure is not limited to this embodiment.

In an embodiment, each of the first comparison voltage $V_{DIV\_ENABLE}$ and the second comparison voltage $V_{DIV}$ may be compared with reference voltages having different levels. For example, the first comparator 143 described with reference to FIG. 4 may compare the first comparison voltage $V_{DIV\_ENABLE}$ with a first reference voltage $V_{REF1}$ (not shown), and the second comparator 144 described with reference to FIG. 4 may compare the second comparison voltage $V_{DIV}$ with a second reference voltage $V_{REF2}$ (not shown). The first reference voltage $V_{REF1}$ may be a voltage higher than the second reference voltage $V_{REF2}$. In this case, discharge of the low voltage detection signal LVCC DETECT may be further delayed as compared with that in the embodiment of FIG. 4. Accordingly, there can be sufficient time required for the power voltage VCCE to be restored to the normal level.

Figure 6:
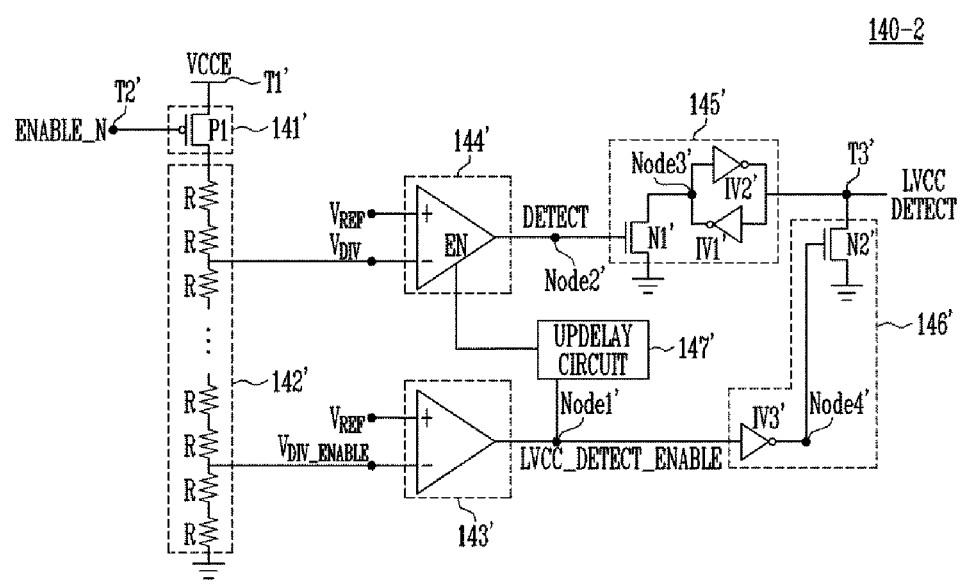
FIG. 6 is a circuit diagram illustrating a low voltage detection circuit according to another embodiment of the present disclosure.

FIG. 6 is a circuit diagram illustrating a low voltage detection circuit 140-2 according to another embodiment of the present disclosure.

Referring to FIG. 6, the low voltage detection circuit 140-2 may include a voltage provider 141', a comparison voltage generator 142', a first comparator 143', a second comparator 144', a detection signal maintainer 145', and an output signal discharger 146'.

The voltage provider 141' may be coupled in series to a power voltage terminal T1' and the comparison voltage generator 142'. The voltage provider 141' may provide a power voltage VCCE input through the power voltage terminal T1' to the comparison voltage generator 142' in response to an operation enable signal ENABLE_N input from an input signal terminal T2'. In an embodiment, the voltage provider 141' may include a first P-type transistor P1'. The operation enable signal ENABLE_N may be provided to a gate of the first P-type transistor P1'.

The comparison voltage generator 142' may be coupled in series between the voltage provider 141' and a ground voltage CND. The comparison voltage generator 142' may generate a first comparison voltage $V_{DIV\_ENABLE}$ and a second comparison voltage $V_{DIV}$ by dividing the power voltage VCCE input from the voltage provider 141'. The comparison voltage generator 142' may provide the generated first comparison voltage $V_{DIV\_ENABLE}$ to the first comparator 143', and provide the generated second comparison voltage $V_{DIV}$ to the second comparator 144'. In an embodiment, the level of the first comparison voltage $V_{DIV\_ENABLE}$ may be lower than that of the second comparison voltage $V_{DIV}$.

In an embodiment, the comparison voltage generator 142' may include a plurality of resistors R. The comparison voltage generator 142' may output the power voltage VCCE as the first comparison voltage $V_{DIV\_ENABLE}$ or the second comparison voltage $V_{DIV}$.

The first comparator 143' may include an operational amplifier (OP AMP). The first comparator 143' may receive the first comparison voltage $V_{DIV\_ENABLE}$ output from the comparison voltage generator 142' through an inverting terminal, and receive a reference voltage $V_{REF}$ through a non-inverting terminal.

The first comparator 143' may compare levels of the first comparison voltage $V_{DIV\_ENABLE}$ and the reference voltage $V_{REF}$. The first comparator 143' may output, to a first node Node1', a result obtained by comparing the levels of the first comparison voltage $V_{DIV\_ENABLE}$ and the reference voltage $V_{REF}$. Specifically, when the level of the first comparison voltage $V_{DIV\_ENABLE}$ is lower than that of the reference voltage $V_{REF}$, the first comparator 143' may output a low voltage detection enable signal LVCC_DETECT_ENABLE. When the level of the first comparison voltage $V_{DIV\_ENABLE}$ is greater than or equal to that of the reference voltage $V_{REF}$, the first comparator 143' may not output the low voltage detection enable signal LVCC_DETECT_ENABLE.

In an embodiment, when the level of the first comparison voltage $V_{DIV\_ENABLE}$ is lower than that of the reference voltage $V_{REF}$, the first comparator 143' may output the low voltage detection enable signal LVCC_DETECT_ENABLE having a logic high level. Alternatively, when the level of the first comparison voltage $V_{DIV\_ENABLE}$ is greater than or equal to that of the reference voltage $V_{REF}$, the first comparator 143' may output the low voltage detection enable signal LVCC_DETECT_ENABLE having a logic low level.

The second comparator 144' may include an operational amplifier (OP AMP). The second comparator 144' may receive a second comparison voltage $V_{DIV}$ output from the comparison voltage generator 142' through an inverting terminal, and receive the reference voltage $V_{REF}$ through a non-inverting terminal. The second comparator 144' may compare the second comparison voltage $V_{DIV}$ and the reference voltage $V_{REF}$. When the second comparison voltage $V_{DIV}$ is lower than the reference voltage $V_{REF}$, the second comparator 144 may output a detection signal DETECT to a second node Node2', In an embodiment, a delay circuit 147' may be coupled between the first node Node1' and the second comparator 144'. The delay circuit 147' may delay the low voltage detection enable signal LVCC_DETECT_ENABLE of the first node Node1' and provide the delayed low voltage detection enable signal LVCC_DETECT_ENABLE to the second comparator 144'.

In an embodiment, the second comparator 144 may operate in response to the low voltage detection enable signal LVCC_DETECT_ENABLE output through the delay circuit 147' as an enable signal. For example, the second comparator 144 may output a result obtained by comparing the second comparison voltage $V_{DIV}$ and the reference voltage $V_{REF}$ only while the low voltage detection enable signal LVCC_DETECT_ENABLE output through the delay circuit 147' is being input.

Specifically, while the low voltage detection enable signal LVCC_DETECT_ENABLE output from the first comparator 143' is being input, the second comparator 144' may output the detection signal DETECT when the second comparison voltage $V_{DIV}$ is lower than the reference voltage $V_{REF}$, and may not output the detection signal DETECT when the second comparison voltage $V_{DIV}$ is greater than or equal to the reference voltage $V_{REF}$. In an embodiment, when the low voltage detection enable signal LVCC_DETECT_ENABLE is not input, the second comparator 144' may not output any signal.

The detection signal maintainer 145' may be coupled between the second node Node2' and an output terminal T3'. The detection signal maintainer 145' may output a low voltage detection signal LVCC DETECT to the output terminal T3' in response to the detection signal DETECT of the second node Node2'. The detection signal maintainer 145' may maintain the low voltage detection signal LVCC DETECT output to the output terminal T3'. Specifically, the detection signal maintainer 145' may include a first N-type transistor N1', a first inverter IV1', and a second inverter IV2'. The first N-type transistor N1' may be coupled between the second node Node2' and a third node Node3'. A gate of the first N-type transistor N1' is coupled to the second node Node2'. A source of the first N-type transistor N1' is coupled to the ground voltage GND. A drain of the first N-type transistor N1' may be coupled to the third node Node3'. The first inverter IV1' and the second inverter IV2' may be coupled in parallel to constitute one latch. One end of the latch may be coupled to the third node Node3', and the other end of the latch may be coupled to the output terminal T3'.

The third node Node3' may have, as an initial value, a voltage of the logic high level. When the second comparator 144' outputs the detection signal DETECT to the second node Node2', the first N-type transistor N1' is turned on, and the third node Node3' may be discharged. The low voltage detection signal LVCC DETECT may be output to the output terminal T3' by the first inverter IV1' and the second inverter IV2'. Even when the second comparator 144' does not output the detection signal DETECT any more, the third node Node3' is maintained to have the voltage of the logic low level by the first inverter IV1' and the second inverter IV2', and the low voltage detection signal LVCC DETECT of the output terminal T3' may be maintained.

The output signal discharger 146' may discharge the low voltage signal LVCC DETECT being output to the output terminal T3'. The output signal discharger 146' may be coupled between the first node Node1' and the output terminal T3'. The output signal discharger 146' may receive the low voltage detection enable signal LVCC_DETECT_ENABLE output to the first node Node1' by the first comparator 143'. The output signal discharger 146' may discharge the output node T3' in response to the low voltage detection enable signal LVCC_DETECT_ENABLE.

The output signal discharger 146' may include a third inverter IV3' and a second N-type transistor N2'. One end of the third inverter IV3' may be coupled to the first node Node1', and the other end of the third inverter IV3' may be coupled to a fourth node Node4'. A gate of the second N-type transistor N2' may be coupled to the fourth node Node4'. A source of the second N-type transistor N2' may be coupled to the ground voltage GND. A drain of the second N-type transistor N2' may be coupled to the output terminal T3'.

When the first comparison voltage $V_{DIV\_ENABLE}$ is lower than the reference voltage $V_{REF}$, the first comparator 143' may output the low voltage detection enable signal LVCC_DETECT_ENABLE to the first node Node1'.

The third inverter IV3' inverts the low voltage detection enable signal LVCC_DETECT_ENABLE and transfers the inverted low voltage detection enable signal LVCC_DETECT_ENABLE to the fourth node Node4'. When the low voltage detection enable signal LVCC_DETECT_ENABLE is in the logic high level, the fourth node Node4' may be in the logic low level. On the contrary, when the low voltage detection enable signal LVCC_DETECT_ENABLE is in the logic low level, the fourth node Node4' may be in the logic high level. The second N-type transistor N2' may be turned on when the fourth node Node4 is in the logic high level, and be turned off when the fourth node Node4' is in the logic low level. Therefore, when the low voltage detection enable signal LVCC_DETECT_ENABLE is in the logic low level, the output signal discharger 146' may discharge the low voltage detection signal LVCC DETECT being output to the output terminal T3'.

Figure 7:
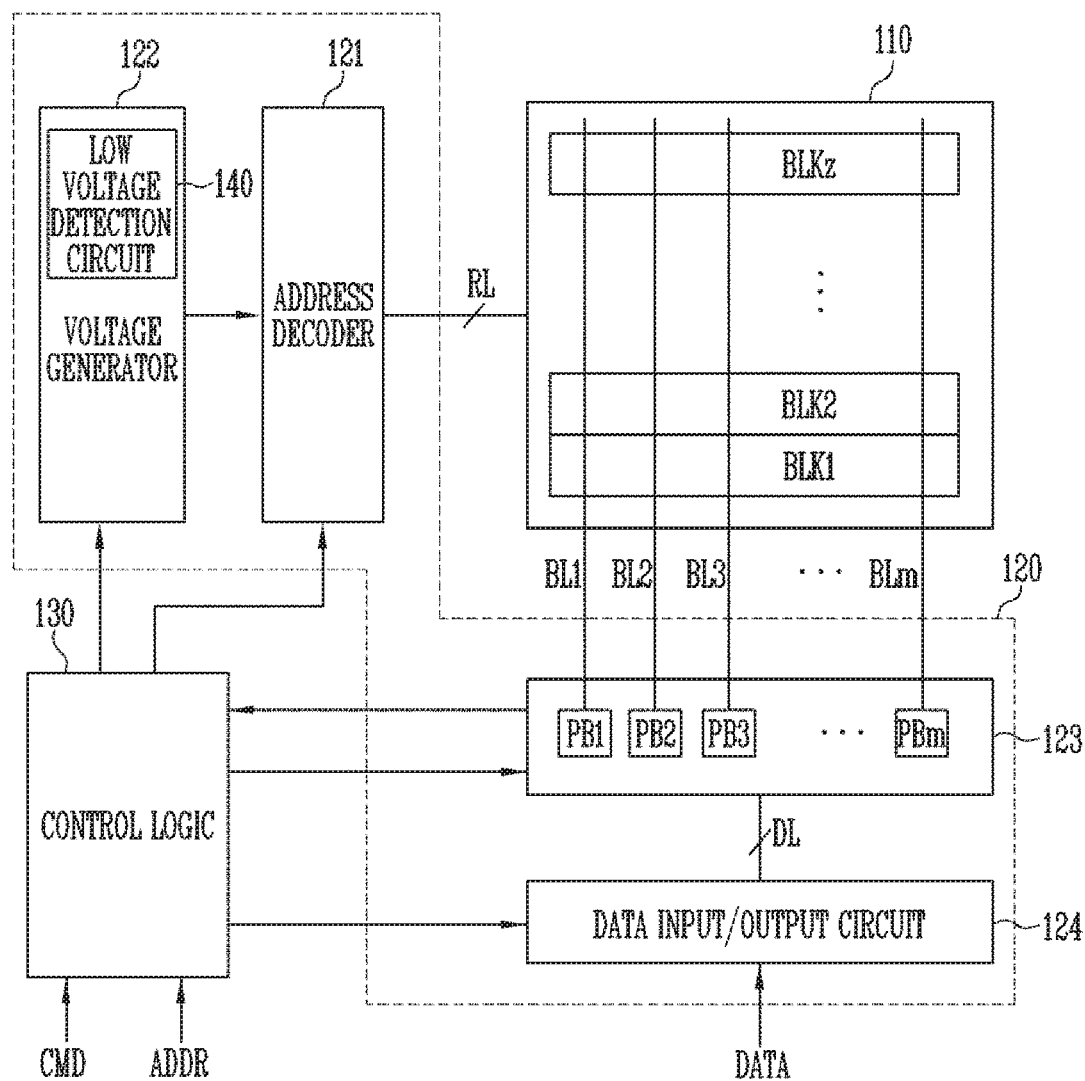
FIG. 7 is a diagram illustrating a structure of a memory device of FIG. 1.

FIG. 7 is a diagram illustrating a structure of the memory device 100 of FIG. 1.

Referring to FIG. 7, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells are nonvolatile memory cells. Among the plurality of memory cells, memory cells coupled to the same word line are defined as one page. That is, the memory cell array 110 is configured with a plurality of pages. In an embodiment, each of the plurality of memory blocks BLK1 to BLKz in the memory cell array 110 may include a plurality of dummy cells. One or more dummy cells may be coupled in series between a drain select transistor and memory cells and between a source select transistor and memory cells.

Each of the memory cells of the memory device 100 may be configured as a single level cell (SLC) for storing one data bit, a multi-level cell (MLC) for storing two data bits, a triple level cell (TLC) for storing three data bits, or a quad level cell (QLC) for storing four data bits.

The peripheral circuit 120 may include the address decoder 121, a voltage generator 122, the read/write circuit 123, and a data input/output circuit 124.

The peripheral circuit 120 drives the memory cell array 110. For example, the peripheral circuit 120 may drive the memory cell array 120 to perform program, read, and erase operations.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate in response to the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line WL of the selected memory block by applying voltages provided from the voltage generator 122 to the word line WL according to the decoded row address.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a pass voltage higher than the read voltage to the unselected word lines.

In an embodiment, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In an embodiment, the address decoder 121 may decode a column address in the address ADDR transmitted thereto. The decoded column address may be transmitted to the read/write circuit 123. As an example, the address decoder 121 may include components such as a row decoder, a column decoder, and an address buffer.

The voltage generator 122 may generate a plurality of voltages by using an external power voltage supplied to the memory device 100. The voltage generator 122 operates in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of voltages having various voltage levels, the voltage generator 122 may include a plurality of pumping capacitors for receiving the internal power voltage, and generate a plurality of voltages by selectively activating the plurality of pumping capacitors in response to the control of the control logic 130.

The plurality of generated voltages may be supplied to the memory cell array 110 by the address decoder 121.

The voltage generator 122 may include a low voltage detection circuit 140. The low voltage detection circuit 140 may provide the low voltage detection signal LVCC DETECT to the control logic 130 when the power voltage VCCE corresponds to the low voltage state. When the low voltage detection signal LVCC DETECT is input, the control logic 130 may discharge a voltage applied to the word lines or bit lines coupled to the memory cell array 110.

In an embodiment, the low voltage detection circuit 140 of FIG. 7 may be configured as described with reference to FIG. 4. In other embodiments, the low voltage detection circuit 140 of FIG. 7 may be the low voltage detection circuit 140-2 described with reference to FIG. 6.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate in response to the control of the control logic 130.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transmit, to selected memory cells, the data DATA to be stored, which is received through the data input/output circuit 124, when a program pulse is applied to a selected word line. The memory cells of the selected page may be programmed according to the transmitted data DATA. A memory cell coupled to a bit line to which a program permission voltage (e.g., a ground voltage) is applied may have an increased threshold voltage. The threshold voltage of a memory cell coupled to a bit line to which a program prohibition voltage (e.g., a power voltage) is applied may be maintained. In a program verify operation, the first to mth page buffers PB1 to PBm read page data from the selected memory cells through the bit lines BL1 to BLm.

In a read operation, the read/write circuit 123 pray read data DATA from memory cells of a selected page through the bit lines BL, and store the read data DATA in the first to mth page buffers PB1 to PBm.

In an erase operation, the read/write circuit 123 may allow the bit lines BL to be floated. In an embodiment, the read/write circuit 123 may include a column select circuit.

The data input/output circuit 124 is coupled to the first to mth page buffers PB1 to PBm through the data lines DL. The data input/output circuit 124 operates in response to the control of the control logic 130.

The data input/output circuit 124 may include a plurality of input/output buffers (not shown) that receive input data. In a program operation, the data input/output circuit 124 may receive data DATA to be stored from an external controller (not shown). In a read operation, the data input/output circuit 124 outputs, to the external controller, data transmitted from the first to meth page buffers PB1 to PBm included in the read/write circuit 123.

The control logic 130 may be coupled to the address decoder 121, the voltage generator 122, the read/write circuit 123, and the data input/output circuit 124. The control logic 130 may be configured to control overall operations of the memory device 100. The control logic 130 may operate in response to a command CMD transmitted from an external device.

Figure 8:
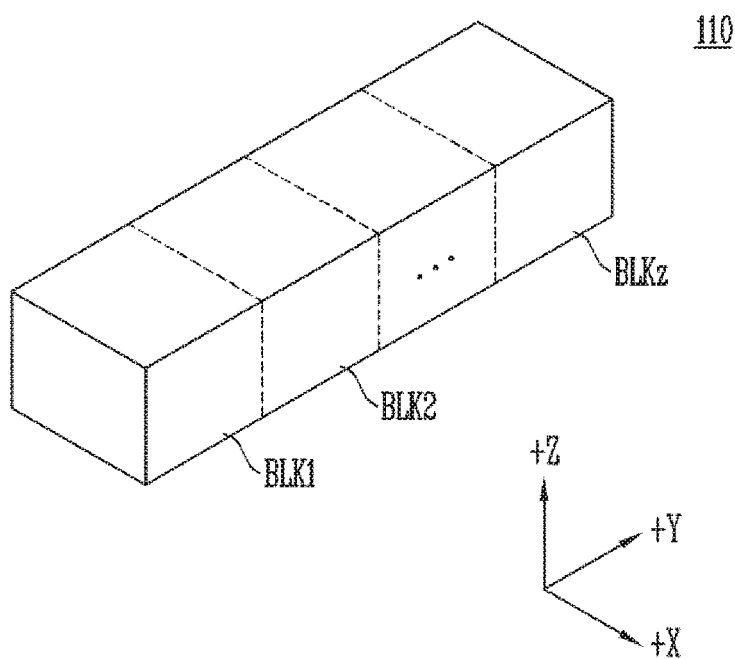
FIG. 8 is a diagram illustrating an embodiment of a memory cell array of FIG. 7.

FIG. 8 is a diagram illustrating an embodiment of the memory cell array of FIG. 7.

Referring to FIG. 8, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. Although FIG. 4 shows memory blocks having the three-dimensional structure, the present disclosure is not limited thereto; memory blocks may also be embodied in a two-dimensional structure. A structure of each memory block will be described in more detail with reference to FIGS. 9 and 10.

Figure 9:
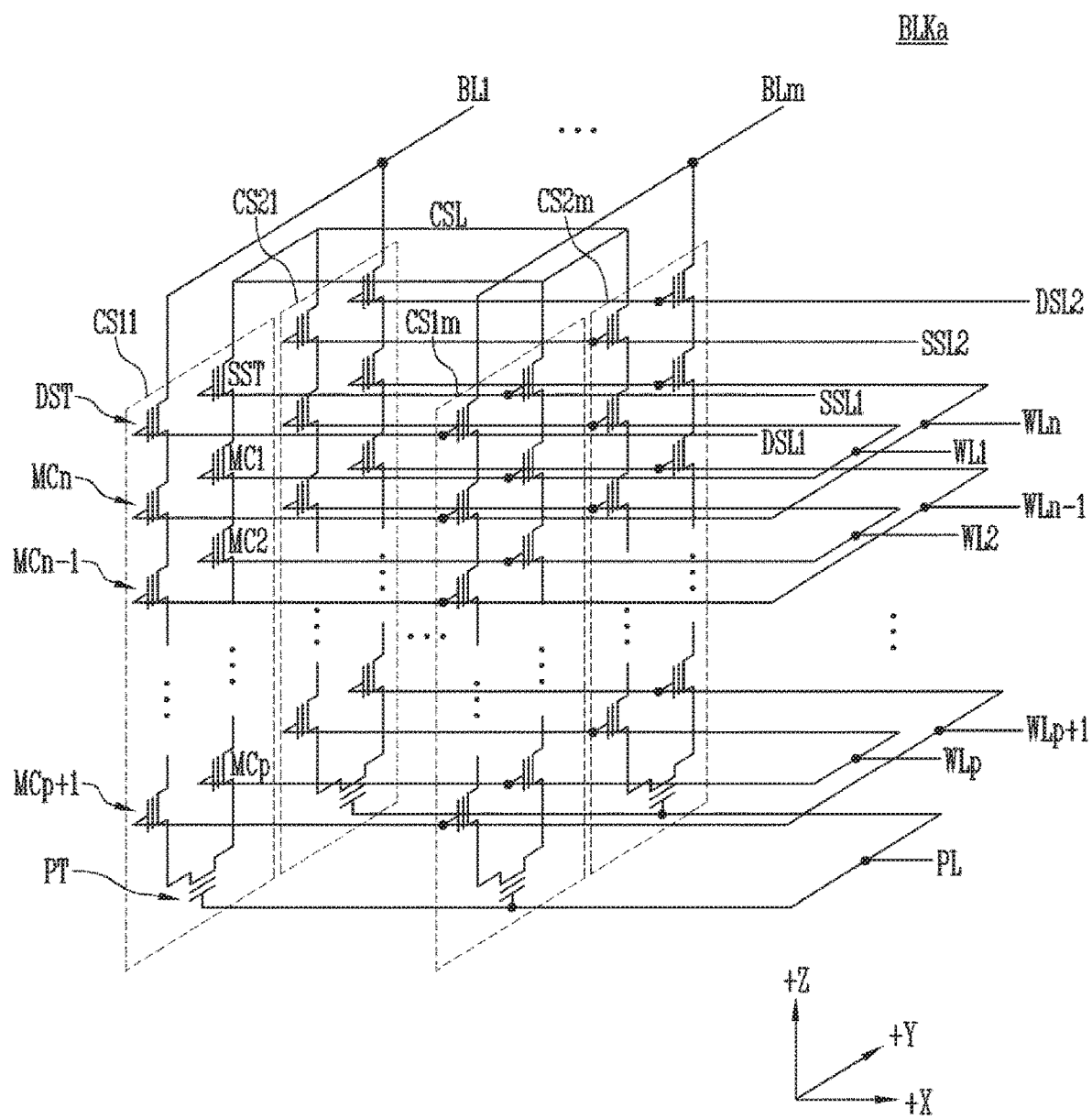
FIG. 9 is a circuit diagram illustrating any one memory block among memory blocks of FIG. 8.

FIG. 9 is a circuit diagram illustrating any one memory block BLKa among the memory blocks BLK1 to BLKz of FIG. 8.

Referring to FIG. 9, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). Although FIG. 9 illustrates two cell strings arranged in a column direction (i.e., a +Y direction), such illustration is for clarity. The present disclosure is not limited thereto. Three or more cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 9, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in a −Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gates of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 9, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1$m$ on the first row constitute one page. Memory cells coupled to the first word line WL1 in the cell strings CS21 to CS2$m$ on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1$m$ or CS21 to CS2$m$ arranged in the row direction may be coupled to the even bit lines, respectively, and odd-numbered cell strings among the cell strings CS11 to CS1$m$ or CS21 to CS2$m$ arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When a larger number of dummy memory cells are provided, the reliability of an operation of the memory block BLKa is improved. On the other hand, the size of the memory block BLKa is increased. When a smaller number of dummy memory cells are provided, the size of the memory block BLKa is decreased. On the other hand, the reliability of an operation of the memory block BLKa may be deteriorated.

In order to efficiently control the dummy memory cell(s), the dummy memory cell(s) may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 10:
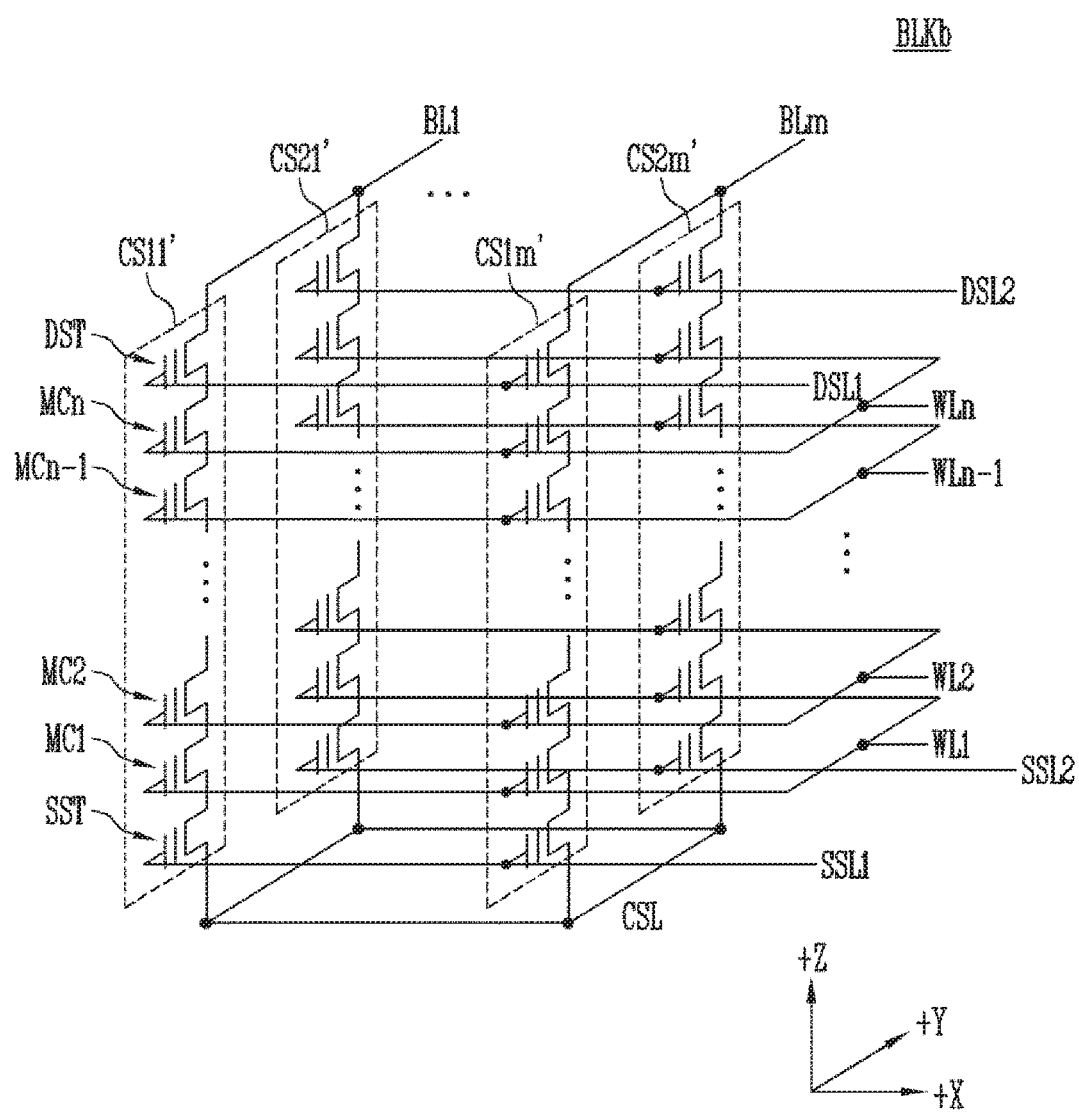
FIG. 10 is a circuit diagram illustrating another embodiment of the one memory block among the memory blocks of FIG. 8.

FIG. 10 is a circuit diagram illustrating another embodiment BLKb of the one memory block among the memory blocks BLK1 to BLKz of FIG. 8.

Referring to FIG. 10, the memory block BLKb may include a plurality of cell strings CS11' to CS1$m$' and CS21' to CS2$m$'. Each of the plurality of cell strings CS11' to CS1$m$' and CS21' to CS2$m$' extends along the +Z direction. Each of the plurality of cell strings CS11' to CS1$m$' and CS21' to CS2$m$' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1$m$' arranged on a first row are coupled to a first source select line SSL1. Source select transistors of the cell strings CS21' to CS2$m$' arranged on a second row are coupled to a second source select line SSL2. In another embodiment, the source select transistors of the cell strings CS11' to CS1$m$' and CS21' to CS2$m$' may be commonly coupled to one source select line.

The first to nth memory cells MC1 to MCn of each cell string are coupled in series between the source select transistor SST and the drain select transistor DST. Gates of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1$m$' on the first row are coupled to a first drain select line DSL1. The drain select transistors of the cell strings CS21' to CS2$m$' on the second row are coupled to a second drain select line DSL2.

Consequently, the memory block BLKb of FIG. 10 has a circuit similar to that of the memory block BLKa of FIG. 9, except that the pipe transistor PT is excluded from each cell string in FIG. 10.

In another embodiment, even bit lines and odd bit lines may be provided instead of the first to mth bit lines BL1 to BLm. In addition, even-numbered cell strings among the cell strings CS11' to CS1$m$' or CS21' to CS2$m$' arranged in the row direction may be coupled to the even bit lines, respectively, and odd-numbered cell strings among the cell strings CS11' to CS1$m$' or CS21' to CS2$m$' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When a larger number of dummy memory cells are provided, the reliability of an operation of the memory block BLKb is improved. On the other hand, the size of the memory block BLKb is increased. When a smaller number of dummy memory cells are provided, the size of the memory block BLKb is decreased. On the other hand, the reliability of an operation of the memory block BLKb may be deteriorated.

In order to efficiently control the dummy memory cell(s), the dummy memory cell(s) may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 11:
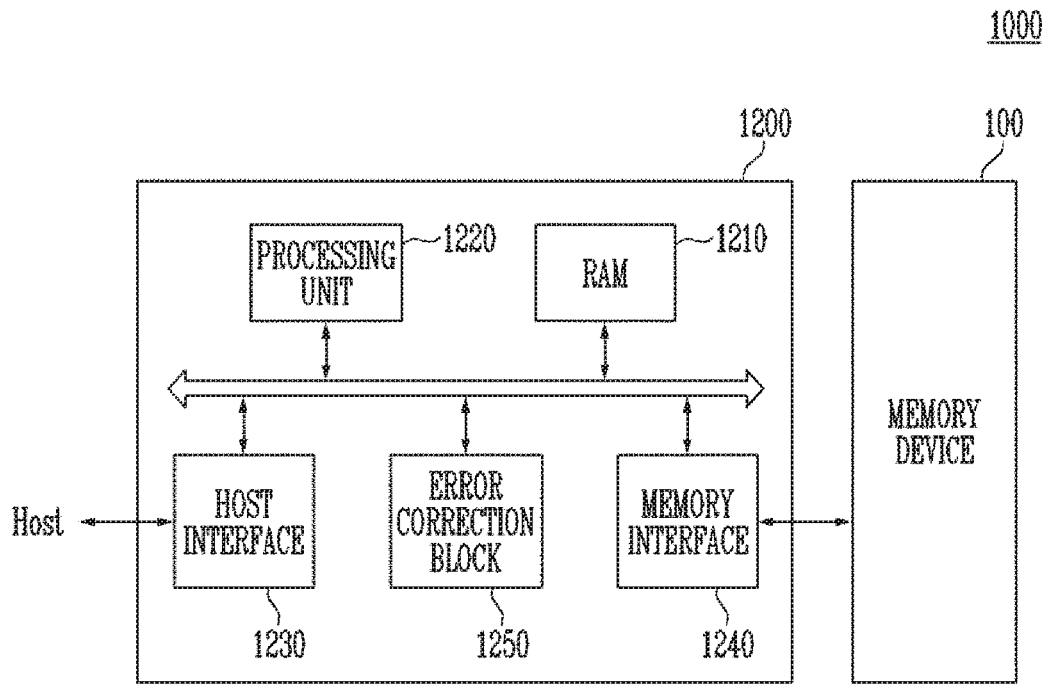
FIG. 11 is a block diagram illustrating a memory system including the memory device of FIG. 7.

FIG. 11 is a block diagram illustrating a memory system 1000 including the memory device 100 of FIG. 7.

Referring to FIG. 11, the memory system 1000 includes a memory device 100 and the controller 1100.

The memory device 100 may be configured and operated as described with reference to FIG. 7. Accordingly, overlapping description is omitted below.

The controller 1200 is coupled to a host (Host) and the memory device 100. The controller 1200 is configured to access the memory device 100 in response to a request from the host. For example, the controller 1200 is configured to control read, write, erase, and background operations of the memory device 100. The controller 1200 is configured to provide an interface between the memory device 100 and the host. The controller 1200 is configured to drive firmware for controlling the memory device 100.

The controller 1200 includes a random access memory (RAM) 1210, a processing unit 1220, a host interface 1230, a memory interface 1240, and an error correction block 1250.

The RAM 1210 is used as at least one of a working memory of the processing unit 1220, a cache memory between the memory device 100 and the host, and a buffer memory between the memory device 100 and the host.

The processing unit 1220 controls overall operations of the controller 1200.

The host interface 1230 includes a protocol for exchanging data between the host and the controller 1200. In an embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The memory interface 1240 interfaces with the memory device 100. For example, the memory interface 1240 may include a NAND interface or a NOR interface.

The error correction block 1250 is configured to detect and correct an error of data received from the memory device 100 by using an error correction code (ECC).

The controller 1200 and the memory device 100 may be integrated into one semiconductor device. In an embodiment, the controller 1200 and the memory device 100 may be integrated into a single semiconductor device to constitute a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or a universal flash storage (UFS).

The controller 1200 and the memory device 100 may be integrated into a single semiconductor device to constitute a semiconductor drive (solid state drive (SSD)), which may be configured to store data in a semiconductor memory. If the memory system 1000 is used as the semiconductor drive SSD, the operating speed of the host coupled to the memory system 1000 can be remarkably improved.

As another example, the memory system 1000 may be provided as one of various components of an electronic device such as a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the memory device 100 or the memory system 1000 may be packaged in various forms such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), or wafer-level processed stack package (WSP).

Figure 12:
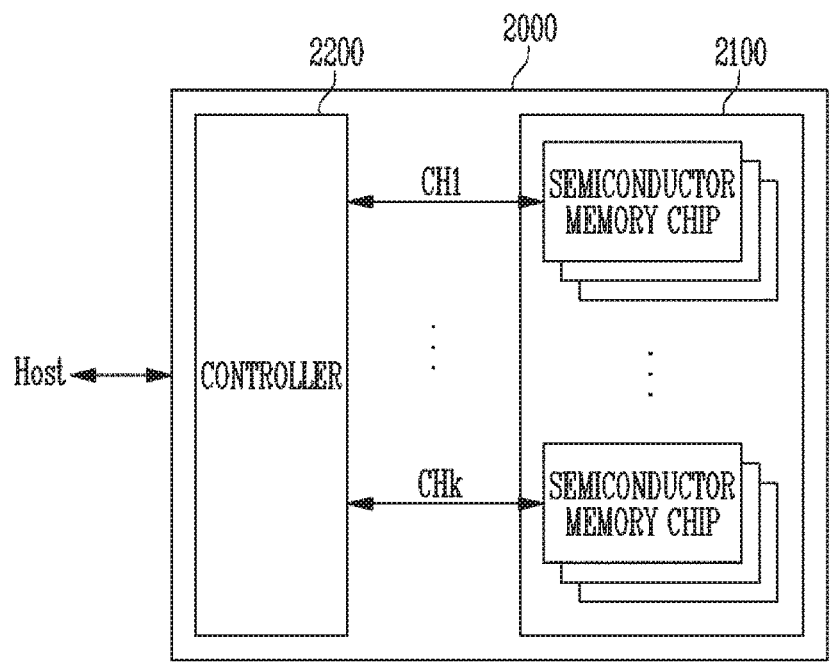
FIG. 12 is a block diagram illustrating an exemplary application of the memory system of FIG. 11.

FIG. 12 is a block diagram illustrating an application example 2000 of the memory system 1000 of FIG. 11.

Referring to FIG. 12, the memory system 2000 includes a memory device 2100 and a controller 2200. The memory device 2100 includes a plurality of semiconductor memory chips. The plurality of semiconductor memory chips are divided into a plurality of groups.

In FIG. 12, it is illustrated that the plurality of groups communicate with the controller 2200 through first to kth channels CH1 to CHk. Each semiconductor memory chip may be configured and operated identically to the memory device 100 described with reference to FIG. 7.

Each group is configured to communicate with the controller 2200 through one common channel. The controller 2200 is configured similarly to the controller 1200 described with reference to FIG. 11. The controller 2200 is configured to control the plurality of memory chips of the memory device 2100 through the plurality of channels CH1 to CHk.

In FIG. 12, it has been illustrated that a plurality of semiconductor memory chips are coupled to one channel. However, it will be understood that the memory system 2000 may be modified such that one semiconductor memory chip is coupled to one channel.

Figure 13:
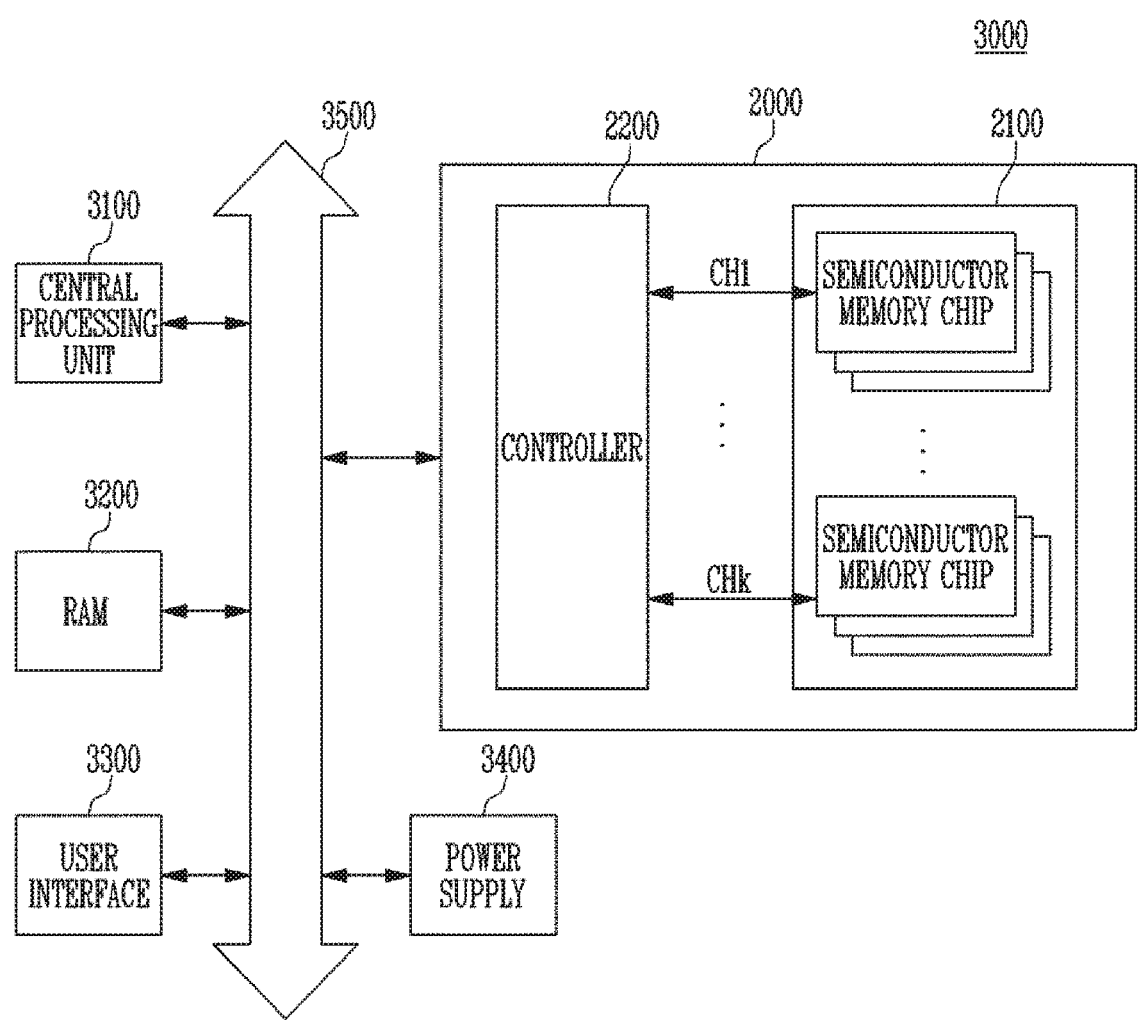
FIG. 13 is a block diagram illustrating a computing system including the memory system described with reference to FIG. 12.

FIG. 13 is a block diagram illustrating a computing system 3000 including the memory system 2000 described with reference to FIG. 12.

Referring to FIG. 13, the computing system 3000 includes a central processing unit (CPU) 3100, a RAM 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data supplied through user interface 3300 or data processed by the CPU 3100 are stored in the memory system 2000.

In FIG. 13, it is illustrated that the semiconductor memory device 2100 is coupled to the system bus 3500 through the controller 2200. However, the semiconductor memory device 2100 may be directly coupled to the system bus 3500. In this case, the function of the controller 2200 may be performed by the CPU 3100 and the RAM 3200.

In FIG. 13, it is illustrated that the memory system 2000 described with reference to FIG. 12 is provided. However, the memory system 2000 may be the memory system 1000 described with reference to FIG. 11. In an embodiment, the computing system 3000 may be configured to include both the memory systems 1000 and 2000 described with reference to FIGS. 11 and 12.

According to the present disclosure, a low voltage detection circuit having accurate detection performance and a memory device including the same are provided.

Various embodiments have been disclosed herein, and although specific terms are employed, they are used and are to be interpreted in a generic and descriptive sense and not for purpose of limitation, In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A low voltage detection circuit comprising:
a comparison voltage generator configured to generate a first comparison voltage and a second comparison voltage having a level higher than that of the first comparison voltage by dividing a power voltage;
a first comparator configured to output a low voltage detection enable signal by comparing the first comparison voltage with a reference voltage;
a second comparator configured to output a detection signal by comparing the second comparison voltage with the reference voltage while the low voltage detection enable signal is being input;
a detection signal maintainer configured to provide a low voltage detection signal to an output terminal according to the detection signal; and
an output signal discharger configured to discharge the low voltage detection signal according to the low voltage detection enable signal.

2. The low voltage detection circuit of claim 1, further comprising a voltage provider configured to provide the power voltage to the comparison voltage generator.

3. The low voltage detection circuit of claim 1, wherein the first comparator outputs the low voltage detection enable signal to have a logic high level when the first comparison voltage is lower than the reference voltage, and outputs the low voltage detection enable signal to have a logic low level when the first comparison voltage is greater than or equal to the reference voltage.

4. The low voltage detection circuit of claim 1, wherein the second comparator outputs the detection signal to have the logic high level when the second comparison voltage is lower than the reference voltage, and outputs the detection signal to have the logic low level when the second comparison voltage is greater than or equal to the reference voltage.

5. The low voltage detection circuit of claim 1, wherein the detection signal maintainer outputs the low voltage detection signal to have the logic high level when the detection signal is changed from the logic low level to the logic high level, and maintains the low voltage detection signal having the logic high level when the detection signal is changed from the logic high level to the logic low level.

6. The low voltage detection circuit of claim 1, wherein the output signal discharger discharges the low voltage detection signal provided to the output terminal when the low voltage detection enable signal is changed from the logic high level to the logic low level.

7. The low voltage detection circuit of claim 1, further comprising a delay circuit configured to delay the low voltage detection enable signal output by the first comparator and then provide the delayed low voltage detection enable signal to the second comparator.

8. The low voltage detection circuit of claim 1, wherein the comparison voltage generator includes a plurality of resistors, and the first comparison voltage and the second comparison voltage are respectively output at preselected nodes between the plurality of resistors.

9. A memory device comprising:
a memory cell array including a plurality of memory cells;
a voltage generator configured to generate an operation voltage to be supplied to the plurality of memory cells; and
control logic configured to provide the operation voltage to the plurality of memory cells or discharge the provided operation voltage,
wherein the voltage generator further includes a low voltage detection circuit configured to output a low voltage detection signal to the control logic when a power voltage input from the outside corresponds to a low voltage state,
wherein the low voltage detection circuit includes:
a comparison voltage generator configured to generate a first comparison voltage and a second comparison voltage having a level higher than that of the first comparison voltage by dividing the power voltage;
a first comparator configured to output a low voltage detection enable signal by comparing the first comparison voltage with a reference voltage;
a second comparator configured to output a detection signal by comparing the second comparison voltage with the reference voltage while the low voltage detection enable signal is being input;
a detection signal maintainer configured to provide a low voltage detection signal to an output terminal according to the detection signal; and
an output signal discharger configured to discharge the low voltage detection signal according to the low voltage detection enable signal.

10. The memory device of claim 9, wherein the low voltage detection circuit further includes a voltage provider configured to provide the power voltage to the comparison voltage generator.

11. The memory device of claim 9, wherein the first comparator outputs the low voltage detection enable signal to have a logic high level when the first comparison voltage is lower than the reference voltage, and outputs the low voltage detection enable signal to have a logic low level when the first comparison voltage is greater than or equal to the reference voltage.

12. The memory device of claim 9, wherein the second comparator outputs the detection signal to have the logic high level when the second comparison voltage is lower than the reference voltage, and outputs the detection signal to have the logic low level when the second comparison voltage is greater than or equal to the reference voltage.

13. The memory device of claim 9, wherein the detection signal maintainer outputs the low voltage detection signal to have the logic high level when the detection signal is changed from the logic low level to the logic high level, and maintains the low voltage detection signal having the logic high level when the detection signal is changed from the logic high level to the logic low level.

14. The memory device of claim 9, wherein the output signal discharger discharges the low voltage detection signal provided to the output terminal when the low voltage detection enable signal is changed from the logic high level to the logic low level.

15. The memory device of claim 9, wherein the low voltage detection circuit further includes a delay circuit configured to delay the low voltage detection enable signal output by the first comparator and then provide the delayed low voltage detection enable signal to the second comparator.

* * * * *